United States Patent
Cho

(10) Patent No.: US 7,259,994 B2
(45) Date of Patent: Aug. 21, 2007

(54) INTEGRATED CIRCUIT MEMORY DEVICES HAVING DATA OUTPUT PORTS THAT SUPPORT EXTENDED READ CYCLE TIME INTERVALS

(75) Inventor: Hyun-Chul Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 107 days.

(21) Appl. No.: 11/265,475

(22) Filed: Nov. 2, 2005

(65) Prior Publication Data

US 2006/0120173 A1  Jun. 8, 2006

(30) Foreign Application Priority Data

Nov. 5, 2004   (KR) ...................... 10-2004-0089947

(51) Int. Cl.
*G11C 11/34* (2006.01)
(52) U.S. Cl. ..................... 365/185.23; 365/189.05; 365/230.08
(58) Field of Classification Search ........... 365/185.23, 365/189.05, 230.08
See application file for complete search history.

(56) References Cited

U.S. PATENT DOCUMENTS 6,947,348 B2 *  9/2005  Kim et al. .................. 365/233

FOREIGN PATENT DOCUMENTS

| KR | 10-1996-035671 | 5/1998 |
|---|---|---|
| KR | 10-1997-000665 | 10/1998 |
| KR | 10-2004-0048745 A | 6/2004 |

* cited by examiner

*Primary Examiner*—Richard T. Elms
*Assistant Examiner*—N Nguyen
(74) *Attorney, Agent, or Firm*—Myers Bigel Sibley & Sajovec PA

(57) ABSTRACT

Memory devices include a memory cell array, a column selection circuit electrically coupled to the memory cell array and a data line driver circuit. The data line driver circuit is configured to drive an output port of the memory device with read data received from the column selection circuit during a read cycle time interval. The data line driver circuit is further configured to support an extended read cycle time interval by switching from a non-latching mode of operation during a leading portion of the read cycle time interval to a latching mode of operation during a trailing portion of the read cycle time interval. The data line driver circuit may include a drive inverter having an output electrically connected to one of a plurality of output pins associated with an output port and a feedback inverter having an input electrically connected to the output of the drive inverter. This feedback inverter may have an output electrically connected to an input of the drive inverter and at least one enable terminal responsive to a data line latch signal. The latching mode of operation may be commenced in response to a leading edge of the data line latch signal.

30 Claims, 5 Drawing Sheets

INTEGRATED CIRCUIT MEMORY DEVICES HAVING DATA OUTPUT PORTS THAT SUPPORT EXTENDED READ CYCLE TIME INTERVALS

REFERENCE TO PRIORITY APPLICATION

This application claims priority to Korean Patent Application No. 2004-89947, filed Nov. 5, 2004, the disclosure of which is hereby incorporated herein by reference.

FIELD OF THE INVENTION

The present invention relates to integrated circuit devices and, more particularly, to integrated circuit memory devices.

BACKGROUND OF THE INVENTION

One class of integrated circuit memory devices includes NAND-type flash memory devices. FIG. 1 illustrates a timing diagram applicable to a conventional NAND-type flash memory device. In particular, FIG. 1 illustrates the timing of a clock enable signal (CLE), an active low chip enable signal (nCE), an active low write enable signal (nWE), an address latch enable signal (ALE), an active low read enable signal (nRE), bus signals (I/Ox) and a control signal R/nB during a memory read operation. To initiate this read operation, a read command (shown as "00h") is received on the I/Ox bus. This read command is followed by a column address (CA1, CA2), a row address (RA1, RA2 and RA3) and a sensing command (shown as "30h"), which are all synchronized with the active low write enable signal nWE (having a period equal to tWC). The column address and the row address are received while the address latch enable signal ALE is active. A data sensing operation is performed during the interval tR. During this interval, the control signal R/nB remains low to reflect a busy condition and sensed data from a selected row is latched. After the time interval tRR, the read enable signal nRE switches low to an active level and the latched read data is produced onto the I/Ox bus. The switching of the read enable signal nRE from low-to-high enables a memory controller (not shown) to receive the data from the I/Ox bus. These and other aspects relating to the timing of a read operation within a memory device are more fully disclosed in U.S. Pat. No. 6,140,635, the disclosure of which is hereby incorporated herein by reference. The period of the read enable signal nRE, which is illustrated as a read cycle time tRC, may vary depending on application. Unfortunately, if the read cycle time tRC becomes excessive, parasitic leakage currents and charge sharing may occur on the data lines providing the read data and read errors may occur.

SUMMARY OF THE INVENTION

Embodiments of the present invention include memory devices that generate stable output data independent of a length of a read cycle time interval. In some of the these embodiments, the memory device may be a flash memory device having a plurality of NAND strings therein containing EEPROM memory cells. These memory devices may include a memory cell array and a column selection circuit electrically coupled to the memory cell array. A data line driver circuit is also provided. This data line driver circuit may be electrically coupled to the column selection circuit.

The data line driver circuit is configured to drive an output port of the memory device with read data received from the column selection circuit during a read cycle time interval. The data line driver circuit is further configured to support an extended read cycle time interval by switching from a non-latching mode of operation during a leading portion of the read cycle time interval to a latching mode of operation during a trailing portion of the read cycle time interval. The data line driver circuit may include a drive inverter having an output electrically connected to one of a plurality of output pins associated with an output port and a feedback inverter having an input electrically connected to the output of the drive inverter. This feedback inverter may have an output electrically connected to an input of the drive inverter and at least one enable terminal responsive to a data line latch signal. According to these embodiments of the invention, the latching mode of operation may be commenced in response to a leading edge of the data line latch signal.

Still further embodiments of the invention include a non-volatile integrated circuit memory device having a flash memory array and a data line driver circuit therein. The data line driver circuit is configured to receive read data from the flash memory array during a read cycle time interval and is further configured to support an extended read cycle time interval. This extended read cycle time interval includes switching from a non-latching mode of operation during a leading portion of the read cycle time interval to a latching mode of operation during a trailing portion of the read cycle time interval. This memory device also includes a column decoder and a data line control unit having an input electrically coupled to the column decoder and an output electrically coupled to the data line driver circuit. The data line control unit is configured to generate an active edge of a data line precharge signal and an active edge of a data line latch signal in sequence during the read cycle time interval. These signals, which are provided to the data line driver circuit, control timing of when the latching mode of operation is enabled.

DETAILED DESCRIPTION OF PREFERRED EMBODIMENTS

Figure 1:
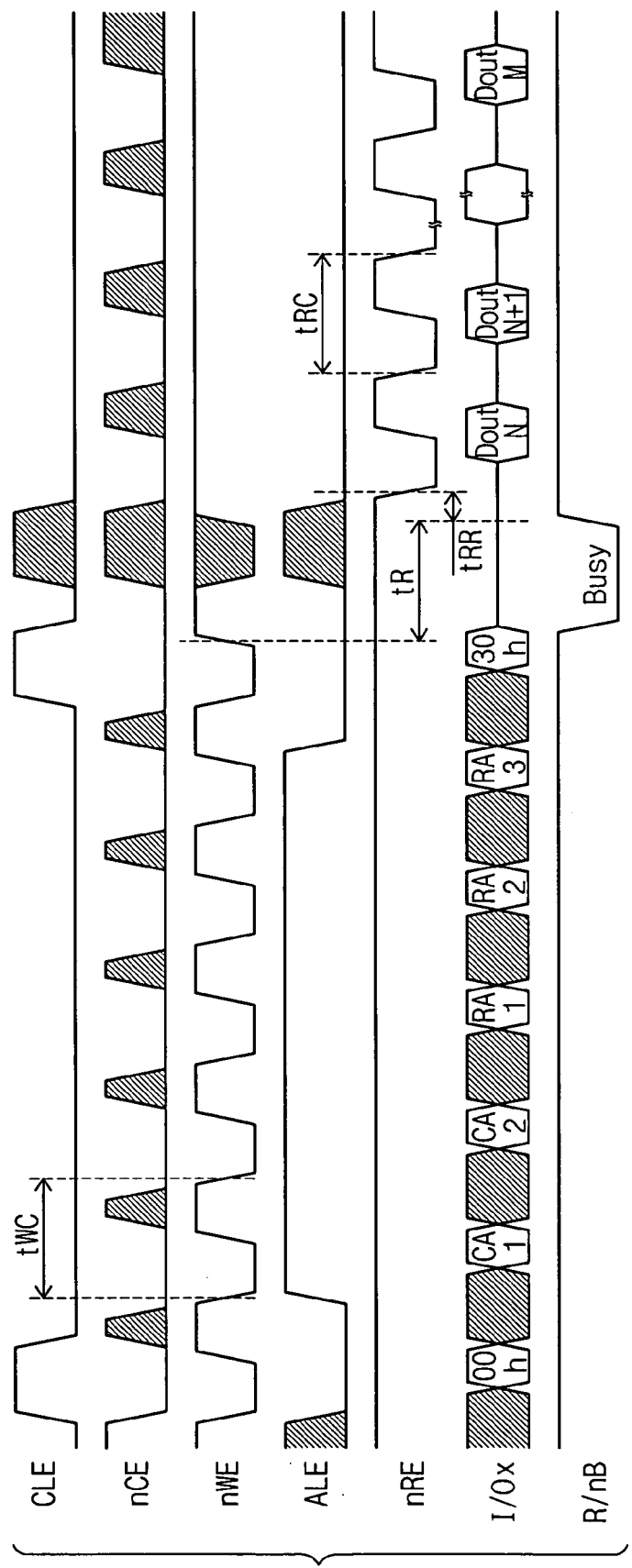
FIG. 1 is a timing diagram that illustrates operation of a conventional flash memory device during a data read operation.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals.

Figure 2:
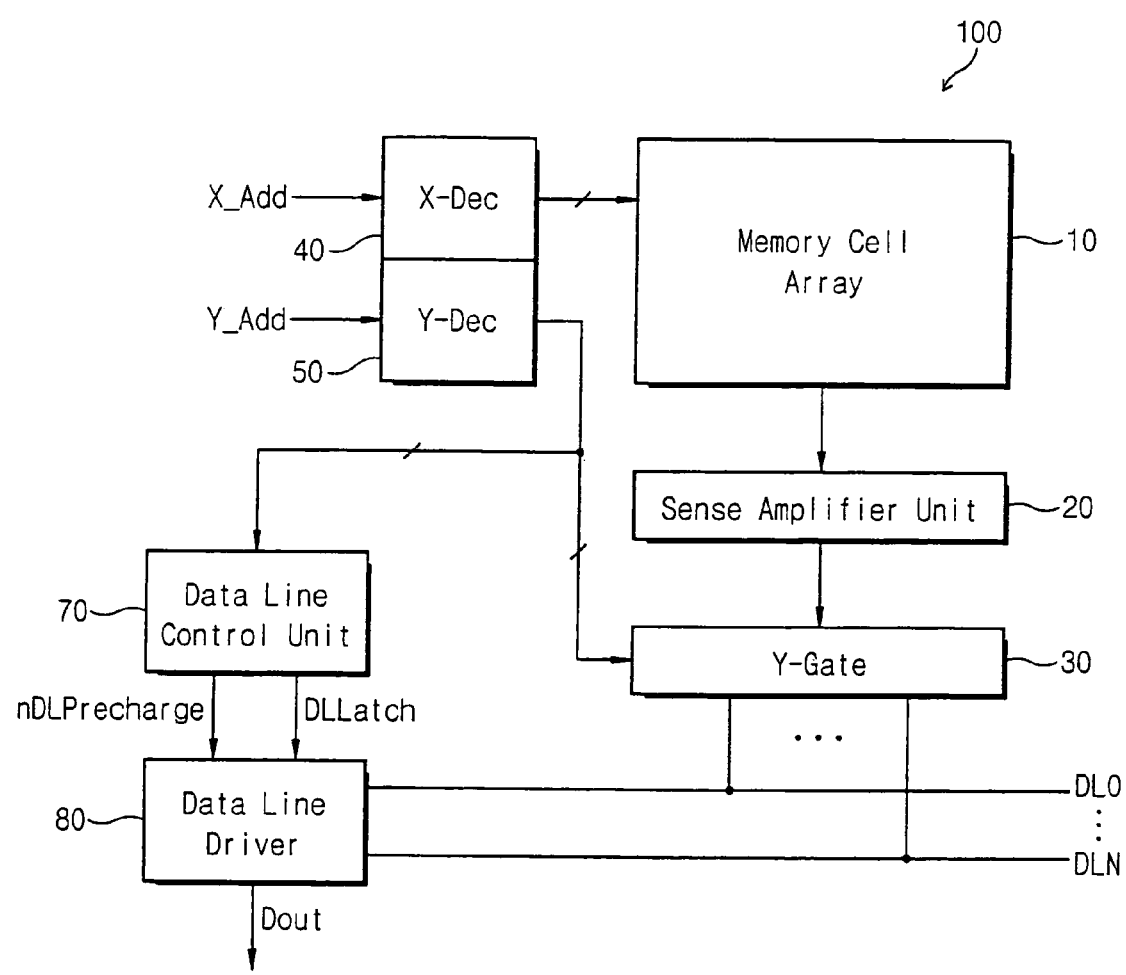
FIG. 2 is a block diagram of an integrated circuit memory device according to an embodiment of the present invention.

FIG. 2 illustrates an integrated circuit memory device 100 according to an embodiment of the present invention. This memory device 100 may, in some embodiments of the invention, be a non-volatile memory device such as a flash memory device. The memory device 100 is illustrated as including a memory cell array 10, a sense amplifier unit 20 and a column selection circuit 30 (shown as Y-Gate). If the memory device 100 is a flash memory device, then the memory cell array 10 may include a plurality of NAND-type strings of EEPROM cells, which are electrically connected to respective bit lines. As will be understood by those skilled in the art, these bit lines may be electrically coupled to the sense amplifier unit 20.

The memory device 100 may also include a row decoder/driver 40 (shown as X-Dec), which is responsive to a row address (shown as X_Add). Upon receipt of a row address, the row decoder/driver 40 may drive a corresponding word line within the memory cell array 10. In the event the memory cell array is an EEPROM array containing a plurality of columns of NAND-type strings of cells, then the row decoder/driver 40 may include a high voltage generating circuit that is configured to generate read, pass and program voltages at sufficient levels to support program (i.e., write) and read operations. A column decoder 50, which is responsive to a column address (shown a Y_Add) is also provided. This column decoder is illustrated as driving the column selection circuit 30 and a data line control unit 70 with a decoded column selection signal (e.g., multi-bit signal). This decoded column selection signal is configured to cause the column selection circuit 30 to pass fully amplified data from the sense amplifier unit 20 to a plurality of data lines DL0-DLn, in response to a read operation. The sense amplifier unit 20 may contain a plurality of latch units that collectively operate as a page buffer during a read operation. If the memory cell array is an EEPROM array, then the sense amplifier unit 20 may also contain logic that verifies programming voltage levels within the memory cells during a program verify operation.

The fully amplified read data is passed from the data lines DL0-DLn to a data line driver circuit 80, which is electrically coupled by a data output bus (DOUT) to an output port of the memory device 100. This output port may be electrically coupled to a memory controller (not shown) by a bus (not shown). This data line driver circuit 80 is responsive to a plurality of control signals. As illustrated, these control signals including an active low data line precharge signal nDLPrecharge and a data line latch signal DLLatch. In response to these control signals, the data line driver circuit 80 performs an inversion operation. The data line driver circuit 80 also performs a latch operation on output data when a read cycle time exceeds a threshold duration. This latch operation improves data reliability by making the value of the output data less susceptible to fluctuations resulting from leakage currents when the output data is being held at the output port for a relatively long time interval before acquisition by a downstream memory controller, for example.

Figure 3:
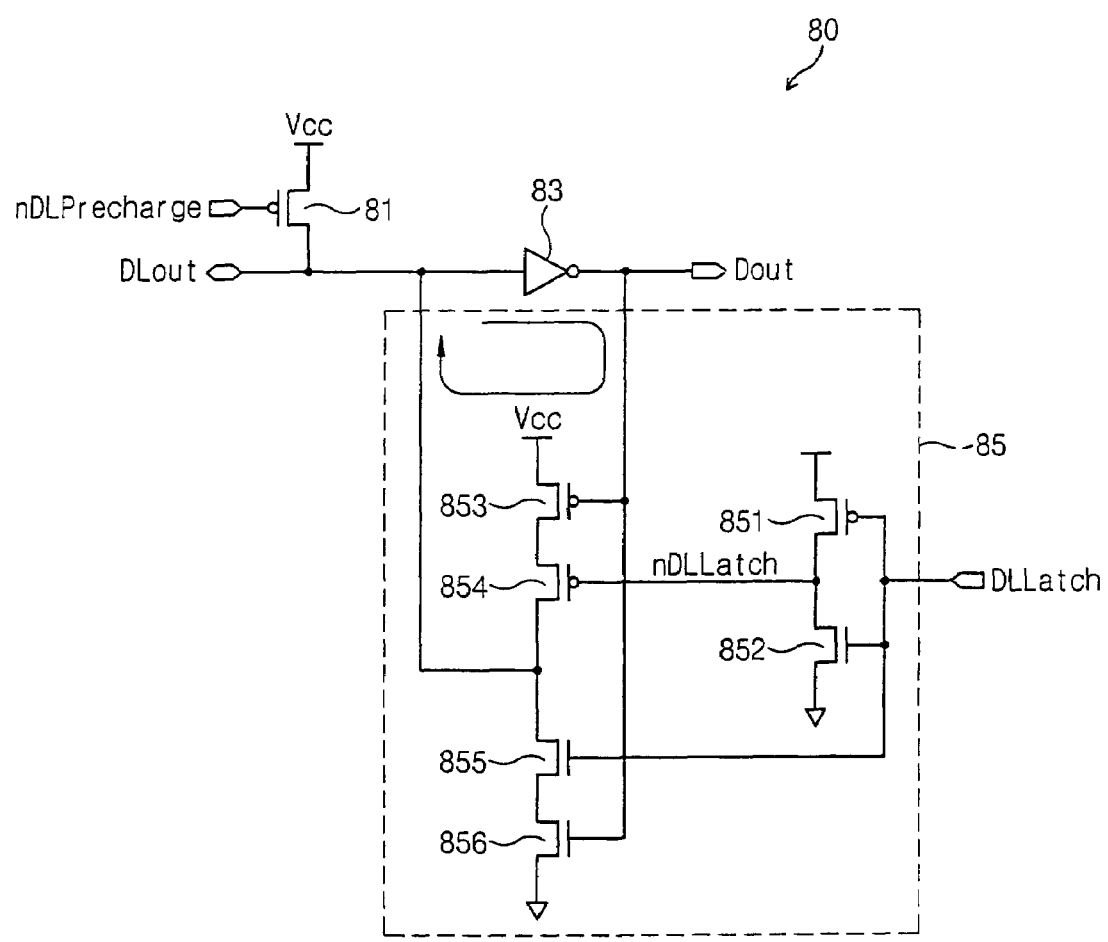
FIG. 3 is an electrical schematic of an embodiment of the data line driver circuit of FIG. 2.

FIG. 3 illustrates an embodiment of the data line driver circuit 80, which may be used in the memory device 100 of FIG. 2. This data line driver circuit 80 includes a PMOS pull-up transistor 81, which is responsive to the active low data line precharge signal nDLPrecharge. Based on this configuration of the pull-up transistor 81, a high-to-low transition of the precharge signal nDLPrecharge will force the corresponding data line (shown as DLout), which is one of the plurality of data lines DL0-DLn, to a logic 1 voltage level (e.g., Vcc). The driver circuit 80 also includes a drive inverter 83, which drives a corresponding line in the data output bus DOUT with inverted data, and a latch circuit 85. This inverted data may represent the originally written data, which was previously inverted prior to programming into the memory array 10. The latch circuit 85 includes a feedback inverter and a control inverter. The feedback inverter includes a vertical totem pole arrangement of two PMOS transistors 853, 854 and two NMOS transistors 855, 856. The control inverter is defined by PMOS transistor 851 and NMOS transistor 852. An input terminal of the control inverter is responsive to the data line latch signal DLLatch, which is generated by the data line control unit 70. An output of the control inverter generates an inverted data line latch signal nDLLatch. Based on this configuration, a low-to-high transition of the data line latch signal DLLatch will enable the latch circuit 85 to perform a latch operation. In particular, when the data line latch signal DLLatch is active (i.e., DLLatch="1"), the feedback inverter will be enabled and the drive inverter 83 and feedback inverter will collectively form a latch device that stably supports the data at the output of the drive inverter 83 during long read cycle time intervals.

Figure 4:
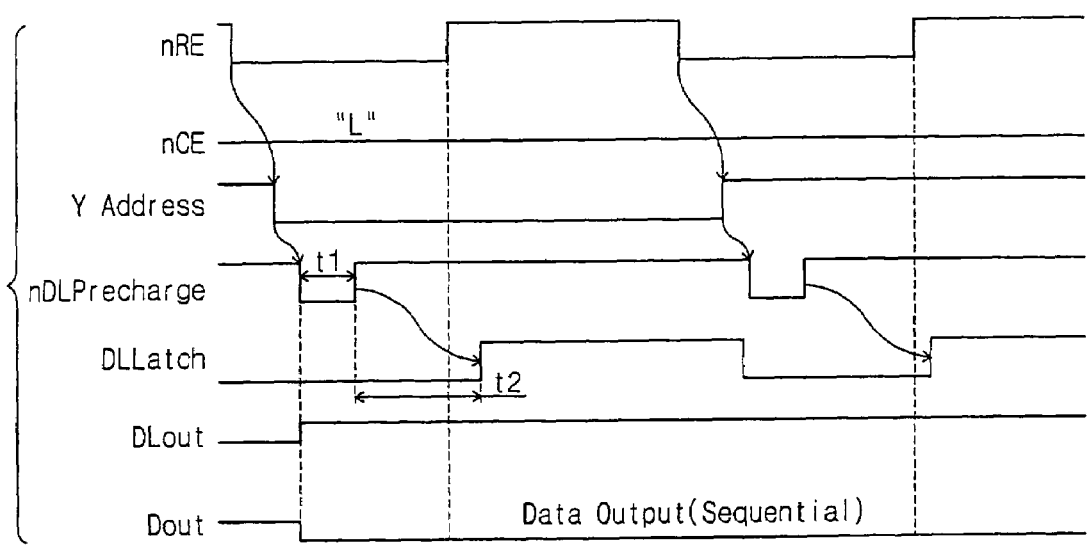
FIG. 4 is a timing diagram illustrating operations performed during a read cycle having a relatively short read cycle time interval.
Figure 5:
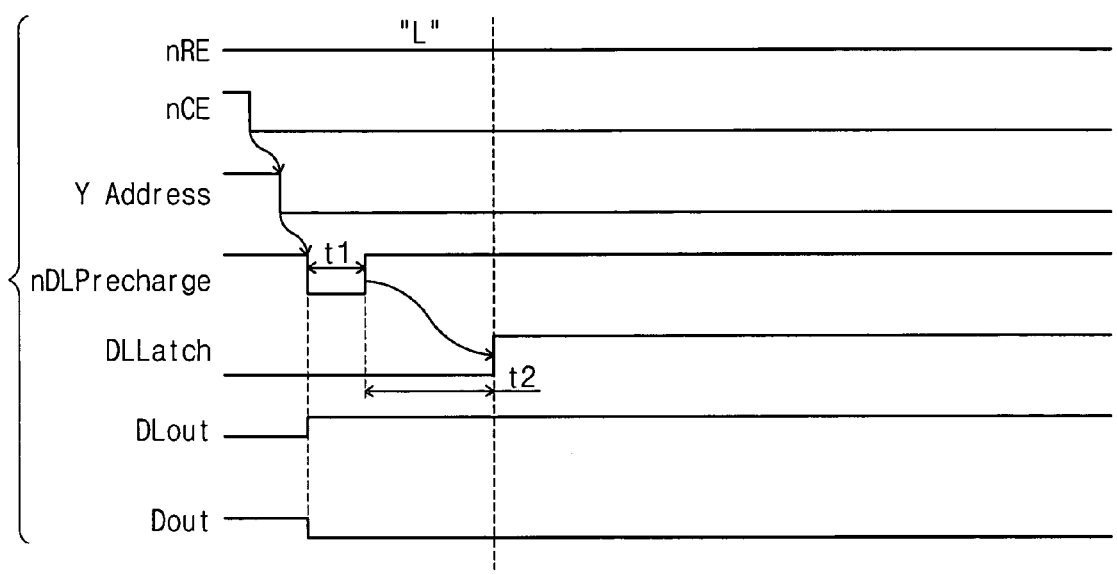
FIG. 5 is a timing diagram illustrating operations performed during a read cycle having a relatively long read cycle time interval.

These aspects of the driver circuit 80 of FIG. 3 are more fully illustrated by the timing diagrams of FIGS. 4-5. In particular, FIG. 4 illustrates operations performed during a read cycle having a relatively short read cycle time interval. This relatively short read cycle time interval is illustrated by the relatively short duration during which the active low read enable signal nRE is asserted. In FIG. 4, the active low chip enable signal nCE is asserted at a logic 0 value and the high-to-low transition of the read enable signal nRE triggers application of a column address (Y Address) and a high-to-low transition of the precharge signal nDLPrecharge. This precharge signal nDLPrecharge is asserted for a duration illustrated by the time interval t1. The data line control unit 70 is configured so that the low-to-high transition of the precharge signal nDLPrecharge sets the timing of when the data line latch signal DLLatch is made active (i.e., switches low-to-high). As illustrated by the vertical dotted line in FIG. 4, the data line latch signal DLLatch is asserted after the read enable signal nRE is deasserted. When this timing condition is present, the read cycle will terminate before the feedback inverter of FIG. 3, which is defined by PMOS transistors 853, 854 and NMOS transistors 855, 856, is enabled. Accordingly, the data DLout provided to the data line driver circuit 80 will be inverted on the output line Dout and passed to a downstream memory controller receiving read data, for example, but no latching of the inverted data will occur within the latch circuit 85.

In contrast, FIG. 5 illustrates operations performed during a read cycle having a relatively short long cycle time interval. This relatively long read cycle time interval is illustrated by the relatively long duration during which the active low read enable signal nRE is asserted at a logic 0 value ("L"). In FIG. 5, the active low chip enable signal nCE is asserted at a logic 0 value and the high-to-low transition of the read enable signal nRE triggers application of a column address (Y Address) and a high-to-low transition of the precharge signal nDLPrecharge. This precharge signal nDLPrecharge is asserted for a duration illustrated by the time interval t1. The data line control unit 70 is configured so that the low-to-high transition of the precharge signal nDLPrecharge sets the timing of when the data line latch signal DLLatch is made active (i.e., switches low-to-high). As illustrated by the vertical dotted line in FIG. 5, the data line latch signal DLLatch is asserted before the read enable signal nRE is deasserted. When this timing condition is present, the read cycle will continue until after the feedback inverter of FIG. 3, is enabled. Accordingly, the data DLout provided to the data line driver circuit 80 will be inverted on the output line Dout and also stably latched within the latch circuit 85.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device, comprising:
   a memory cell array;
   a column selection circuit electrically coupled to said memory cell array; and
   a data line driver circuit configured to drive an output port of the memory device with read data received from said column selection circuit during a read cycle time interval and further configured to support an extended read cycle time interval by switching from a non-latching mode of operation during a leading portion of the read cycle time interval to a latching mode of operation during a trailing portion of the read cycle time interval.

2. The memory device of claim 1, wherein the output port comprises a plurality of output pins; and wherein said data line driver circuit comprises a drive inverter having an output electrically connected to one of the plurality of output pins and a feedback inverter having an input electrically connected to the output of the drive inverter, an output electrically connected to an input of the drive inverter and an enable terminal responsive to a data line latch signal.

3. The memory device of claim 1, wherein the latching mode of operation is commenced in response to a leading edge of the data line latch signal.

4. The memory device of claim 1, wherein said memory cell array is a flash memory array; and wherein the feedback inverter is configured as a totem pole arrangement of two PMOS transistors in series with two NMOS transistors.

5. The memory device of claim 1, wherein the feedback inverter is configured as a totem pole arrangement of two PMOS pull-up transistors in series with two NMOS pull-down transistors.

6. The memory device of claim 5, further comprising a control inverter having an input responsive to a data line latch signal and an output electrically connected a gate terminal of one of the two PMOS pull-up transistors.

7. A non-volatile integrated circuit memory device, comprising:
   a flash memory array; and
   a data line driver circuit configured to receive read data from said flash memory array during a read cycle time interval and further configured to support an extended read cycle time interval by switching from a non-latching mode of operation during a leading portion of the read cycle time interval to a latching mode of operation during a trailing portion of the read cycle time interval.

8. The memory device of claim 7, further comprising a column decoder and a data line control unit having an input electrically coupled to the column decoder and an output electrically coupled to said data line driver circuit.

9. The memory device of claim 8, wherein said data line driver circuit is responsive to a data line precharge signal and a data line latch signal; and wherein the data line control unit is configured to generate an active edge of the data line precharge signal and an active edge of the data line latch signal in sequence during the read cycle time interval.

10. The memory device of claim 9, wherein said data line driver circuit comprises a drive inverter having an output electrically connected to an output port of the memory device and a feedback inverter having an input electrically connected to the output of the drive inverter, an output electrically connected to an input of the drive inverter and an enable terminal responsive to the data line latch signal.

11. A flash memory device comprising:
    a memory cell array consisting of a plurality of memory cells;
    an address decoding unit decoding a row address and a column address of a memory cell to be read;
    a data sensing unit sensing data in a memory cell corresponding to the decoded address; and
    a data line driver outputting the sensed data in reversely, wherein the data line driver selectively latches the reversed data in accordance with a length of a read cycle time with respect to the data.

12. The device of claim 11, wherein the data line driver outputs the sensed data in reversely and latches the reversed data at the same time, if the read cycle time is longer than a predetermined reference time.

13. The device of claim 11, wherein the data line driver outputs the sensed data in reversely, if the read cycle time with respect to the data is shorter than the reference time.

14. The device of claim 11, wherein the data line driver includes a precharge unit precharging the sensed data into a predetermined level before reversing the sensed data.

15. The device of claim 11, wherein the data line driver includes a latch circuit for latching the reversed data.

16. The device of claim 15, wherein the latch circuit latches the reversed data if the read cycle time is longer than the reference time.

17. The device of claim 15, wherein the latch circuit is activated a predetermined time passes after a precharge of the data is started.

18. The device of claim 15, wherein the latch circuit feeds back the reversed data to uniformly maintain a level of the sensed data.

19. The device of claim 14, further comprising a data line control unit controlling operations of the data line driver in response to the decoded column address.

20. The device of claim 19, wherein the data line control unit generates a first control signal precharging the sensed data, if a specific column address is detected.

21. The device of claim 20, wherein the data line control unit generates a second control signal latching the reversed data a predetermined time passes after the precharge activation signal is generated.

22. A flash memory device comprising:
    a memory cell array consisting of a plurality of memory cells;
    an address decoding unit decoding a row address and a column address of a memory cell to be read;
    a data sensing unit detecting data in a memory cell corresponding to the decoded address;
    a data line driver outputting the sensed data in reversely, wherein the data line driver selectively latches the reversed data in accordance with a length of the read cycle time with respect to the data; and
    a data line control unit controlling operations of the data line driver in response to the decoded column address.

23. The device of claim 22, wherein the data line driver outputs the sensed data in reversely, and latches the reversed data at the same time, if the read cycle time is longer than a predetermined reference time.

24. The device of claim 22, wherein the data line driver outputs the sensed data in reversely, if a read cycle time with respect to the data is shorter than the reference time.

25. The device of claim 22, wherein the data line driver comprises;
   a precharging unit precharging the sensed data in a predetermined level;
   an inverter reversing the precharged data; and
   a latch circuit latching the reversed data to uniformly maintain a level of the precharged data using the latched data.

26. The device of claim 25, wherein the latch circuit is activated if the read cycle time is longer than the reference time.

27. The device of claim 25, wherein the latch circuit is activated a predetermined time passes after a precharge of the data is started.

28. The device of claim 25, wherein the latch circuit feeds back the reversed data into the inverter.

29. The device of claim 25, wherein the data line control unit activates the precharge unit when the decoded column address is changed.

30. The device of claim 25, wherein the data line control unit activates the latch circuit a predetermined time passes after a precharge of the data is started.

* * * * *